(12) United States Patent
Sugawara et al.

(10) Patent No.: US 11,225,709 B2
(45) Date of Patent: *Jan. 18, 2022

(54) MN—ZN—O SPUTTERING TARGET AND PRODUCTION METHOD THEREFOR

(71) Applicant: Dexerials Corporation, Tokyo (JP)

(72) Inventors: Junichi Sugawara, Tome (JP); Yuichi Kamori, Tome (JP)

(73) Assignee: Dexerials Corporation, Tokyo (JP)

( * ) Notice: Subject to any disclaimer, the term of this patent is extended or adjusted under 35 U.S.C. 154(b) by 70 days.

This patent is subject to a terminal disclaimer.

(21) Appl. No.: 16/320,192

(22) PCT Filed: Jul. 11, 2017

(86) PCT No.: PCT/JP2017/025276
§ 371 (c)(1),
(2) Date: Jan. 24, 2019

(87) PCT Pub. No.: WO2018/021016
PCT Pub. Date: Feb. 1, 2018

(65) Prior Publication Data
US 2019/0242009 A1    Aug. 8, 2019

(51) Int. Cl.
*C23C 14/34* (2006.01)
*C04B 35/00* (2006.01)
(Continued)

(52) U.S. Cl.
CPC .......... *C23C 14/3421* (2013.01); *C04B 35/00* (2013.01); *C04B 35/453* (2013.01);
(Continued)

(58) Field of Classification Search
CPC ... C04B 35/01; C04B 35/453; C23C 14/0036; C23C 14/08; C23C 14/081;
(Continued)

(56) References Cited

U.S. PATENT DOCUMENTS

| | | | |
|---|---|---|---|
| 5,236,632 A | * | 8/1993 | Ogawa .................. C04B 35/453 |
| | | | 252/519.5 |
| 2013/0082218 A1 | * | 4/2013 | Ebata ................ C04B 35/62675 |
| | | | 252/518.1 |
| 2015/0132606 A1 | * | 5/2015 | Kurokawa ........... C01G 45/006 |
| | | | 428/696 |

FOREIGN PATENT DOCUMENTS

| | | |
|---|---|---|
| CN | 100572325 C | 12/2009 |
| JP | 2001316808 A | 11/2001 |

(Continued)

OTHER PUBLICATIONS

Huafu et al. "Low-temperature deposition of transparent conducting Mn—W co-doped ZnO thin films", Journal of Semiconductors, vol. 31, No. 8, Aug. 2010 (Year: 2010).*

(Continued)

*Primary Examiner* — Rodney G McDonald
(74) *Attorney, Agent, or Firm* — Kenja IP Law PC

(57) ABSTRACT

Provided are a Mn—Zn—O sputtering target that can be used for DC sputtering and a production method therefor. The Mn—Zn—O sputtering target has a chemical composition containing Mn, Zn, O, and an element X (X is one or two elements selected from the group consisting of W and Mo). A surface to be sputtered of the target has an arithmetic mean roughness Ra of 1.5 µm or less or a maximum height Ry of 10 µm or less.

3 Claims, 1 Drawing Sheet

(51) Int. Cl.
  *H01J 37/34* (2006.01)
  *C23C 14/08* (2006.01)
  *C23C 14/00* (2006.01)
  *C04B 35/453* (2006.01)

(52) U.S. Cl.
  CPC .......... *C23C 14/0036* (2013.01); *C23C 14/08* (2013.01); *C23C 14/081* (2013.01); *C23C 14/086* (2013.01); *C23C 14/3414* (2013.01); *H01J 37/3429* (2013.01); *H01J 37/3491* (2013.01)

(58) Field of Classification Search
  CPC .............. C23C 14/086; C23C 14/3414; C23C 14/3421; H01J 37/3429; H01J 37/3491
  USPC ....................................... 204/298.12, 298.13
  See application file for complete search history.

(56) References Cited

FOREIGN PATENT DOCUMENTS

| | | | |
|---|---|---|---|
| JP | 2005314131 A | 11/2005 |
| TW | 201403593 A | 1/2014 |
| WO | 2013183277 A1 | 12/2013 |
| WO | 2015068535 A1 | 5/2015 |

OTHER PUBLICATIONS

Jan. 29, 2019, International Preliminary Report on Patentability issued in the International Patent Application No. PCT/JP2017/025276.

Sep. 5, 2017, International Search Report issued in the International Patent Application No. PCT/JP2017/025276.

Zhang Huafu et al., Low-temperature deposition of transparent conducting Mn—W co-doped ZnO thin films, Journal of Semiconductors, Aug. 2010, pp. 083005-1 to 083005-3, vol. 31, No. 8.

Apr. 7, 2020, Office Action issued by the China National Intellectual Property Administration in the corresponding Chinese Patent Application No. 201780042540.8.

Zhang Hua-Fu et al., Effect of Film Thickness on the Properties of Transparent Conductive Mn—W Co-doped Zinc Oxide Films, Journal of Synthetic Crystals, Feb. 2011, pp. 166-169, vol. 40, No. 1.

May 19, 2020, Notification of Reasons for Refusal issued by the Japan Patent Office in the corresponding Japanese Patent Application No. 2016-147104.

Dec. 9, 2020, Office Action issued by the China National Intellectual Property Administration in the corresponding Chinese Patent Application No. 201780042540.8.

Dec. 16, 2020, Office Action issued by the Taiwan Intellectual Property Office in the corresponding Taiwanese Patent Application No. 106124220.

Mar. 18, 2021, Office Action issued by the China National Intellectual Property Administration in the corresponding Chinese Patent Application No. 201780042540.8.

* cited by examiner

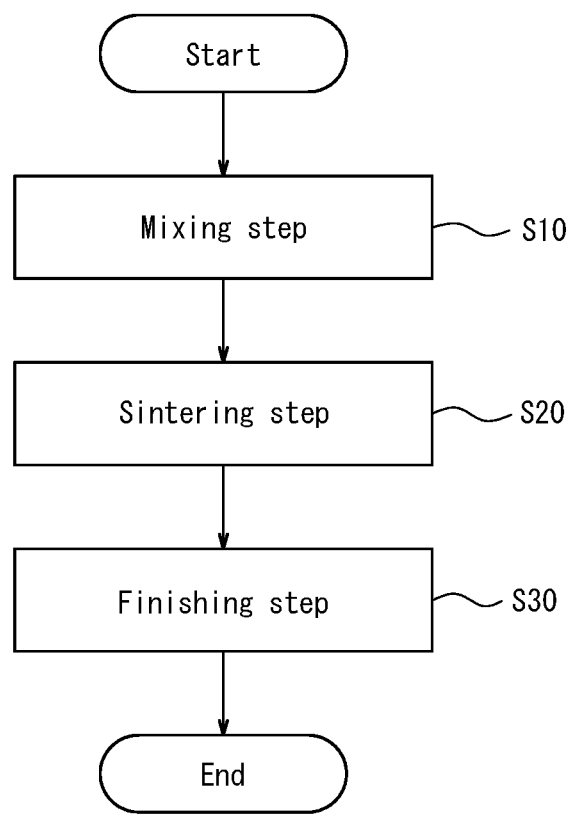

MN—ZN—O SPUTTERING TARGET AND PRODUCTION METHOD THEREFOR

TECHNICAL FIELD

This disclosure relates to a Mn—Zn—O sputtering target and a production method therefor, and in particular relates to a Mn—Zn—O sputtering target that is suitable for use in forming a recording layer of an optical information recording medium and has a chemical composition containing an element X (X is W or Mo), and a production method therefor.

BACKGROUND

A sputtering method whereby Ar ions or the like are caused to collide with a sputtering target formed from an alloy or sintered material is used in a wide range of technical fields such as glass coating, semiconductor device production, flat panel display production, and optical information recording medium (writable optical disc) recording layer formation.

Among these fields, in the technical field of optical information recording media, for example, there is increasing demand for higher capacity as increasingly large amounts of data are handled. Optical information recording media can be broadly classified as either read-only or writable, and writable optical information recording media can be further categorized into two types: recordable (write-once) and rewritable. Conventionally, organic dye materials have been widely studied as recording layer materials for recordable optical discs, but with the recent trend toward higher capacity, inorganic materials are now also being widely studied.

At present, materials based on oxides of palladium have been put into actual use as inorganic recording layer materials for recordable optical discs. However, Pd is a rare metal and, as a result, has high material cost. Therefore, materials based on oxides of manganese are also being developed as materials through which adequate recording characteristics can be obtained at cheap material cost.

In one example of a recording layer formed from a material based on an oxide of manganese as described above, PTL 1 proposes a Mn—Zn-Ma-O recording layer that contains an oxide of Mn and an oxide of a metal Ma (Ma is selected from Mg, Mo, Si, and Te), and further contains a metal M (selected from Sn, Zn, Bi, etc.). Moreover, PTL 1 discloses co-sputtering (multi-target sputtering) as a specific method for forming the Mn—Zn-Ma-O recording layer. Through the technique described in PTL 1, a recording layer formed from a Mn—Zn-Ma-O material can be obtained without using the rare metal Pd.

CITATION LIST

Patent Literature

PTL 1: WO 2013/183277 A1

SUMMARY

Technical Problem

When a layer containing a plurality of elements is to be formed by sputtering, such as a Mn—Zn-Ma-O recording layer formed from the material described above, one method that can be adopted is multi-target sputtering in which targets formed from the respective elements are sputtered as disclosed in PTL 1. In an alternative method, sputtering may be performed by using a composite target containing a plurality of elements as a single target. Multi-target sputtering has drawbacks such as requiring larger equipment, leading to increased cost, and being susceptible to deviations in composition. Therefore, the adoption of direct current (DC) sputtering using a single composite target is preferable from a viewpoint of mass production.

PTL 1 proposes, as a sputtering target for use in production of an information recording medium, a target that includes an oxide of Mn, wherein the oxide of Mn is partially or fully present in an oxide state for which the valence of Mn is less than +4. PTL 1 also proposes that in this target, the oxide of Mn present in the aforementioned oxide state is preferably $Mn_3O_4$ that does not thermally decompose. Moreover, PTL 1 proposes that the target may further contain a metal other than Mn or an oxide of a metal other than Mn, and that this other metal is at least one selected from the group consisting of Sn, Zn, Bi, Ge, Co, W, Cu, and Al. PTL 1 also proposes that optional metal elements from among Zr, Al, Ta, Mo, Si, Mg, Hf, V, Ti, Sb, and Te may be added.

However, PTL 1 does not allude to a specific Mn—Zn—O composite sputtering target. That is, a Mn—Zn—O composite sputtering target having a chemical composition containing Mn, Zn, an element X (X is W or Mo), and O has not yet been established.

Accordingly, an objective of this disclosure is to provide a Mn—Zn—O sputtering target containing an element X (X is W or Mo) and a production method therefor.

Solution to Problem

The inventors conducted extensive studies to achieve the above objectives in which they attempted to prepare a Mn—Zn—W—O sputtering target using manganese oxide powder, zinc oxide powder, and tungsten oxide powder as raw materials. Moreover, the inventors also attempted to prepare a Mn—Zn—Mo—O sputtering target by replacing the tungsten oxide powder used for the Mn—Zn—W—O sputtering target with molybdenum oxide powder as a raw material. The inventors used these sputtering targets for DC sputtering and found that anomalous discharge (also referred to as "arcing") occurred. The inventors then attempted to prepare a Mn—Zn—W—O sputtering target and a Mn—Zn—Mo—O sputtering target by changing all of the raw materials to metal powders of the respective elements described above. However, the inventors found that preparation of a sputtering target was, in itself, difficult in this situation because zinc metal has a low melting point compared to zinc oxide.

In view of the above, the inventors conceived an idea of preparing a Mn—Zn—O sputtering target using a combination of oxide powder and metal powder as raw materials. The inventors found that when a surface to be sputtered of the obtained target has an arithmetic mean roughness Ra of 1.5 μm or less or a maximum height Ry of 10 μm or less, anomalous discharge does not occur even when the target is used for DC sputtering. This finding led to the present disclosure.

This disclosure is based on the above findings by the inventors and provides the following as a solution to the problems set forth above. Specifically, this disclosure provides:

<1> A Mn—Zn—O sputtering target comprising a chemical composition containing Mn, Zn, O, and an element X, with a proviso that X is one or two elements selected from the group consisting of W and Mo, wherein a surface to be sputtered of the Mn—Zn—O sputtering target has an arithmetic mean roughness Ra of 1.5 µm or less or a maximum height Ry of 10 µm or less.

The Mn—Zn—O sputtering target according to the foregoing <1> is a Mn—Zn—O sputtering target that can be used for DC sputtering. Moreover, through the Mn—Zn—O sputtering target according to the foregoing <1>, DC sputtering can be performed without the occurrence of anomalous discharge.

<2> The Mn—Zn—O sputtering target according to the foregoing <1>, wherein the chemical composition contains 4 at % to 40 at % of Mn, 15 at % to 60 at % of Zn, and 5 at % to 40 at % of the element X relative to 100 at %, in total, of Mn, Zn, and the element X.

<3> The Mn—Zn—O sputtering target according to the foregoing <1> or <2>, wherein the chemical composition further contains at least one element selected from the group consisting of Cu, Mg, Ag, Ru, Ni, Zr, Sn, Bi, Ge, Co, Al, In, Pd, Ga, Te, V, Si, Ta, Cr, and Tb.

<4> The Mn—Zn—O sputtering target according to the foregoing <3>, wherein the at least one element selected from the group consisting of Cu, Mg, Ag, Ru, Ni, Zr, Sn, Bi, Ge, Co, Al, In, Pd, Ga, Te, V, Si, Ta, Cr, and Tb has a content of 8 at % to 70 at % relative to 100 at %, in total, of constituent elements of the Mn—Zn—O sputtering target, exclusive of O.

<5> A production method for producing the Mn—Zn—O sputtering target according to the foregoing <1>, comprising:

a mixing step of wet mixing a mixed powder including a powder of an oxide of manganese, a powder of an oxide of zinc, and a metal powder containing the element X for 12 hours or more;

a sintering step of sintering the mixed powder at a temperature of 700° C. or higher after the mixing step; and a finishing step of smoothing a surface to be sputtered of the Mn—Zn—O sputtering target after the sintering step.

Through the production method according to the foregoing <5>, a Mn—Zn—O sputtering target that can be used for DC sputtering can be produced. Moreover, through a Mn—Zn—O sputtering target produced by the method according to the foregoing <5>, DC sputtering can be performed without the occurrence of anomalous discharge.

<6> The production method according to the foregoing <5>, wherein the mixed powder further includes a powder containing a simple substance or a compound of at least one element selected from the group consisting of Cu, Mg, Ag, Ru, Ni, Zr, Sn, Bi, Ge, Co, Al, In, Pd, Ga, Te, V, Si, Ta, Cr, and Tb.

Advantageous Effect

According to this disclosure, it is possible to solve the conventional problems set forth above and achieve the above objective, and to provide a Mn—Zn—O sputtering target that can be used for DC sputtering and a production method therefor.

BRIEF DESCRIPTION OF THE DRAWING

In the accompanying drawing,
FIG. 1 is a flowchart illustrating a production method for a sputtering target according to a disclosed embodiment.

DETAILED DESCRIPTION (Mn—Zn—O Sputtering Target)

A presently disclosed Mn—Zn—O sputtering target has a chemical composition containing Mn, Zn, an element X, and O. The following provides a detailed description of the disclosed Mn—Zn—O sputtering target, which is also referred to herein simply as a "target". Note that the element X is one or two elements selected from the group consisting of W and Mo. In the following description, this is also stated simply as "(element) X is W or Mo".

<Target>

A target according to a disclosed embodiment has a chemical composition that contains Mn, Zn, the element X, and O, and may further contain other components as necessary.

<<Element X>>

As previously described, the element X is W or Mo. In other words, the element X may be composed of one element that is W or may be composed of one element that is Mo. Moreover, the element X may be composed of two elements that are W and Mo. When the element X is composed of two elements that are W and Mo, this means that the chemical composition of the target contains both W and Mo.

<<Arithmetic Mean Roughness Ra and Maximum Height Ry>>

It is important that the target according to the present embodiment has a surface to be sputtered with an arithmetic mean roughness Ra of 1.5 µm or less or a maximum height Ry of 10 µm or less. As demonstrated in the subsequently described EXAMPLES, studies carried out by the inventors revealed that anomalous discharge does not occur during DC sputtering in a case in which the surface to be sputtered of the target has an arithmetic mean roughness of 1.5 µm or less or a maximum height Ry of 10 µm or less.

The term "arithmetic mean roughness Ra" as used in this disclosure refers to the arithmetic mean roughness (Ra) (units: µm) based on JIS B0601(1994). Moreover, the term "maximum height (Ry)" as used in this disclosure refers to the maximum height (Ry) (units: µm) based on JIS B0601 (1994).

As set forth above, the sputtering target according to the present embodiment is a Mn—Zn—O sputtering target that can be used for DC sputtering and that allows DC sputtering to be performed without the occurrence of anomalous discharge. The target according to the present embodiment is particularly suitable for use in forming a recording layer of an optical information recording medium, but the use of the target is not in any way limited.

<<Component Ratio>>

The ratio of components in the target according to the present embodiment can be selected as appropriate depending on the objective without any specific limitations and may be set such that the target contains 4 at % to 40 at % of Mn, 15 at % to 60 at % of Zn, and 5 at % to 40 at % of the element X relative to 100 at %, in total, of Mn, Zn, and the element X.

<<Other Components>>

The target according to the present embodiment may further contain other metal elements as necessary. For example, in a situation in which the target according to the present embodiment is to be used for forming a recording layer of an information recording medium, transmittance, reflectance, and recording sensitivity of the recording layer can be altered, and a recording layer having a multilayer structure can be obtained through appropriate inclusion of such metal elements. The chemical composition of the target according to the present embodiment preferably further contains at least one element selected from the group consisting of Cu, Mg, Ag, Ru, Ni, Zr, Sn, Bi, Ge, Co, Al, In, Pd, Ga, Te, V, Si, Ta, Cr, and Tb for the objective described above.

-Component Ratio of Other Components-

The content of the at least one element selected from the group consisting of Cu, Mg, Ag, Ru, Ni, Zr, Sn, Bi, Ge, Co, Al, In, Pd, Ga, Te, V, Si, Ta, Cr, and Tb may be set as 8 at % to 70 at % relative to 100 at %, in total, of all constituent elements of the sputtering target, exclusive of O (oxygen), and may be selected as appropriate from this range depending on the use of the target.

No specific limitations are placed on the shape of the target according to the present embodiment and the target may have any shape such as a disc shape, a cylindrical shape, a quadrilateral plate shape, a rectangular plate shape, or a square plate shape. The shape of the target can be selected as appropriate depending on the use thereof. Moreover, the width and depth (diameter in the case of a circular shape) of the target can be selected as appropriate from a range of the order of millimeters (mm) to meters (m) depending on the use of the target. In the case of a circular shape, the diameter of the target is typically about 50 mm to 300 mm. The same applies to the thickness of the target which is typically about 1 mm to 20 mm.

<Production Method for Sputtering Target>

Next, a production method for the target according to the disclosed embodiment is described with reference to FIG. 1. The production method for the target according to the disclosed embodiment includes a mixing step (S10), a sintering step (S20), and a finishing step (S30), and may further include other steps that are appropriately selected as necessary.

<<Mixing Step (S10)>>

The mixing step (S10) is a step of wet mixing a mixed powder including a powder of an oxide of manganese, a powder of an oxide of zinc, and a metal powder containing the element X for 12 hours or more.

The method of wet mixing can be selected as appropriate depending on the objective without any specific limitations and may, for example, be a wet mixing method using a conventional and commonly known ball mill. The following describes the mixed powder that is mixed in this mixing step and also the mixing conditions.

The mixed powder includes a powder of an oxide of manganese, a powder of an oxide of zinc, and a metal powder containing the element X, and may include other powders as necessary.

-Powder of Oxide of Manganese-

The powder of an oxide of manganese can be selected as appropriate depending on the objective and may, for example, be $Mn_3O_4$ (manganese (II,III) oxide), $Mn_2O_3$ (manganese(III) oxide), or the like, with other examples besides $Mn_3O_4$ and $Mn_2O_3$ including MnO, $MnO_2$, $MnO_3$, $Mn_2O_7$, and the like. One of these oxides of manganese may be used individually, or two or more of these oxides of manganese may be used together.

Of these examples, $Mn_3O_4$ powder is more preferable. This is due to the relationship between the sintering temperature and melting point.

The average particle diameter of the powder of an oxide of manganese can be selected as appropriate depending on the objective. Moreover, the average particle diameter of $Mn_3O_4$ powder may be about 3 μm to 7 μm as is commercially available.

-Powder of Oxide of Zinc-

The powder of an oxide of zinc can be selected as appropriate depending on the objective and may, for example, be zinc oxide (ZnO) powder, zinc peroxide ($ZnO_2$) powder, or the like. One of these oxides of zinc may be used individually, or two or more of these oxides of zinc may be used together.

Of these examples, ZnO powder is more preferable. This is due to the relationship between the sintering temperature and melting point.

The average particle diameter of the powder of an oxide of zinc can be selected as appropriate depending on the objective. Moreover, the average particle diameter of ZnO powder can be about 1 μm to 3 μm as is commercially available.

-Metal Powder Containing Element X-

The metal powder containing the element X can be selected as appropriate depending on the objective and may, for example, be a tungsten metal powder composed of a simple substance of W, a molybdenum metal powder composed of a simple substance of Mo, or the like. One of these powders may be used individually, or two or more of these powders may be used together. In a case in which X is W and Mo, a tungsten metal powder and a molybdenum metal powder are used together.

The average particle diameter of the metal powder containing the element X can be selected as appropriate depending on the objective. The average particle diameter of tungsten metal powder may be about 2 μm to 5 μm as is commercially available. Moreover, the average particle diameter of molybdenum metal powder may be about 1 μm to 5 μm as is commercially available.

-Other Powders-

Examples of other powders that can be selected as appropriate depending on the objective include powders formed from a simple substance or compound of at least one element selected from the group consisting of Cu, Mg, Ag, Ru, Ni, Zr, Sn, Bi, Ge, Co, Al, In, Pd, Ga, Te, V, Si, Ta, Cr, and Tb. Such powders may be included in the mixed powder depending on the desired objective of the produced target.

-Mixing Time-

In the present embodiment, it is important that wet mixing of the mixed powder is performed for 12 hours or more. A mixing time of 12 hours or more enables adequate mixing of the mixed powder, and can, therefore, promote a solid phase reaction of a manganese oxide during sintering and inhibit the presence of a residual manganese oxide crystalline phase after sintering. Within the range set forth above, a mixing time of 16 hours or more is preferable, a mixing time of 20 hours or more is more preferable, and a mixing time of 24 hours or more is most preferable. Although mixing may be performed for 24 hours or more, the effect of mixing reaches saturation when mixing is performed for 24 hours. An upper limit of 168 hours may be set for the mixing time in consideration of industrial productivity, but this is not intended to be a restriction on the upper limit.

<<Sintering Step (S20)>>

The sintering step (S20) is a step that is performed after the mixing step (S10) and in which sintering of the mixed powder is performed at a temperature of 700° C. or higher.

-Sintering-

The method of sintering can be selected as appropriate depending on the objective without any specific limitations and may, for example, be hot pressing or hot isostatic pressing (HIP) in an inert gas atmosphere.

In the present embodiment, it is important that sintering of the mixed powder is performed at a temperature of 700° C. or higher. A sintering temperature of 700° C. or higher can inhibit the presence of a residual manganese oxide crystalline phase after sintering.

The sintering time can be selected as appropriate without any specific limitations and may, for example, be a typically adopted sintering time of about 1 hour to 6 hours.

<<Finishing Step (S30)>>

The finishing step (S30) is a step that is performed after the sintering step (S20) and in which smoothing of a surface to be sputtered of the target is performed.

The finishing step may be carried out using a surface grinder. Specifically, grinding may be carried out using a diamond whetstone or an abrasive whetstone. Thereafter, finishing may be performed using a polishing pad such as Scotch-Brite® (Scotch-Brite is a registered trademark in Japan, other countries, or both) to smooth the surface to be sputtered of the target.

Through the steps described above, a Mn—Zn—O sputtering target having a surface to be sputtered with an arithmetic mean roughness Ra of 1.5 μm or less or a maximum height Ry of 10 μm or less can be produced.

<<Other Steps>>

Other steps can be selected as appropriate depending on the objective without any specific limitations. Examples of other steps that may be performed include a mixed powder shaping step.

-Shaping Step-

The mixed powder shaping step is not essential in the disclosed production method, but may be included for shaping in accordance with the target shape.

Examples 1

The following provides a more detailed description of the disclosed techniques through examples. However, the disclosed techniques are not in any way limited by the following examples and various alterations may be made that do not deviate from the essential scope thereof.

As described below, Examples 1-1 and 1-2 were prepared as targets according to this disclosure and Comparative Examples 1-1 and 1-2 were prepared as comparative targets with W used as the element X, and the number of occurrences of anomalous discharge was evaluated.

Example 1-1

The following powders were prepared as raw material powders.

$Mn_3O_4$ powder (purity: 99.9% or higher, average particle diameter: 5 μm)

ZnO powder (purity: 99.9% or higher, average particle diameter: 1.4 μm)

W powder (purity: 99.9% or higher, average particle diameter: 2 μm)

The $Mn_3O_4$ powder, ZnO powder, and W powder were weighed out such that the proportions of metal elements satisfied Mn:Zn:W=20:50:30 (at %). The weighed-out raw material powders, zirconia balls (diameter 5 mm) in an amount equivalent to three times the total weight of the raw material powders, and alcohol were added into a plastic container and were subjected to wet mixing for 24 hours in a ball mill. The resultant mixed powder was dried and was then sifted through a sieve having a pore size of 500 μm. Next, the sifted powder was subjected to hot pressing in an inert gas atmosphere with a sintering temperature of 900° C., a sintering time of 2 hours, and a pressure of 200 kgf/cm². The surface of a target obtained through this sintering was finished using a surface grinder such as to have an arithmetic mean roughness Ra of 0.5 μm and a maximum height Ry of 4 μm. The values of the arithmetic mean roughness Ra and the maximum height Ry were measured using a SURFCOM 480A produced by Tokyo Seimitsu Co., Ltd. Finally, the target was bonded to a backing plate made of oxygen-free copper using In solder to produce a target according to Example 1-1.

Example 1-2

A target was produced in the same way as in Example 1-1. However, the abrasive grain size in finishing of the surface to be sputtered of the target was changed such that the surface had an arithmetic mean roughness Ra of 1.5 μm and a maximum height Ry of 10 μm to thereby produce a target according to Example 1-2. All other conditions were the same as in Example 1-1.

Comparative Example 1-1

A target was produced in the same way as in Example 1-1. However, the abrasive grain size in finishing of the surface to be sputtered of the target was changed such that the surface had an arithmetic mean roughness Ra of 1.6 μm and a maximum height Ry of 12 μm to thereby produce a target according to Comparative Example 1-1. All other conditions were the same as in Example 1-1.

Comparative Example 1-2

A target was produced in the same way as in Example 1-1. However, the abrasive grain size in finishing of the surface to be sputtered of the target was changed such that the surface had an arithmetic mean roughness Ra of 2.0 and a maximum height Ry of 20 μm to thereby produce a target according to Comparative Example 1-2. All other conditions were the same as in Example 1-1.

<Evaluation of Number of Occurrences of Anomalous Discharge>

The number of occurrences of anomalous discharge was evaluated for the targets according to Examples 1-1 and 1-2 and Comparative Examples 1-1 and 1-2. Specifically, the targets according to Examples 1-1 and 1-2 and Comparative Examples 1-1 and 1-2 were each installed in a sputtering apparatus and used to perform DC sputtering. Note that the inside of the sputtering apparatus was evacuated to $1\times10^{-4}$ Pa or lower, and Ar gas and $O_2$ gas were introduced into the apparatus to provide an apparatus internal pressure of 0.3 Pa. The partial pressure of oxygen ($[O_2]/[Ar+O_2]$) was set as 70%. A DC power supply was used to apply 5 W/cm² of electrical power and sputtering was performed for 30 minutes. An arcing counter was used to count the number of occurrences of anomalous discharge during sputtering. Note that anomalous discharge straight after discharge was not counted. The obtained results are shown in Table 1.

TABLE 1

| Target | Arithmetic mean roughness Ra (μm) | Maximum height Ry (μm) | Number of occurrences of anomalous discharge |
|---|---|---|---|
| Example 1-1 | 0.5 | 4.0 | 0 |
| Example 1-2 | 1.5 | 10.0 | 0 |
| Comparative Example 1-1 | 1.6 | 12.0 | 30 |
| Comparative Example 1-2 | 2.0 | 20.0 | 80 |

It can be seen from Table 1 that when the element X was W, the number of occurrences of anomalous discharge was 0 for the targets according to Examples 1-1 and 1-2 that each satisfied a condition of the surface to be sputtered thereof having an arithmetic mean roughness Ra of 1.5 μm or less or a maximum height Ry of 10 μm or less, and these targets therefore enable sputtering without anomalous discharge. In contrast, it can be seen that the number of occurrences of anomalous discharge was at least 30 for Comparative Examples 1-1 and 1-2 in which the surface to be sputtered of the target had an arithmetic mean roughness Ra of more than 1.5 μm or a maximum height Ry of more than 10 μm.

Examples 2

As described below, Examples 2-1 and 2-2 were prepared as targets according to this disclosure and Comparative Examples 2-1 and 2-2 were prepared as comparative targets with Mo used as the element X, and the occurrence of anomalous discharge was evaluated.

Example 2-1

The following powders were prepared as raw material powders. $Mn_3O_4$ powder (purity: 99.9% or higher, average particle diameter: 5 μm)

ZnO powder (purity: 99.9% or higher, average particle diameter: 1.4 μm)

Mo powder (purity: 99.9% or higher, average particle diameter: 2 μm)

The $Mn_3O_4$ powder, ZnO powder, and Mo powder were weighed out such that the proportions of metal elements satisfied Mn:Zn:Mo=20:50:30 (at %). The weighed-out raw material powders, zirconia balls (diameter 5 mm) in an amount equivalent to three times the total weight of the raw material powders, and alcohol were added into a plastic container and were subjected to wet mixing for 24 hours in a ball mill. The resultant mixed powder was dried and was then sifted through a sieve having a pore size of 500 μm. Next, the sifted powder was subjected to hot pressing in an inert gas atmosphere with a sintering temperature of 900° C., a sintering time of 2 hours, and a pressure of 200 kgf/cm². The surface of a target obtained through this sintering was finished using a surface grinder such as to have an arithmetic mean roughness Ra of 0.5 μm and a maximum height Ry of 4 μm. The arithmetic mean roughness Ra and the maximum height Ry were measured using a SURFCOM 480A produced by Tokyo Seimitsu Co., Ltd. Finally, the target was bonded to a backing plate made of oxygen-free copper using In solder to produce a target according to Example 2-1.

Example 2-2

A target was produced in the same way as in Example 2-1. However, the abrasive grain size in finishing of the surface to be sputtered of the target was changed such that the surface had an arithmetic mean roughness Ra of 1.5 μm and a maximum height Ry of 10 μm to thereby produce a target according to Example 2-2. All other conditions were the same as in Example 2-1.

Comparative Example 2-1

A target was produced in the same way as in Example 2-1. However, the abrasive grain size in finishing of the surface to be sputtered of the target was changed such that the surface had an arithmetic mean roughness Ra of 1.6 μm and a maximum height Ry of 12 μm to thereby produce a target according to Comparative Example 2-1. All other conditions were the same as in Example 2-1.

Comparative Example 2-2

A target was produced in the same way as in Example 2-1. However, the abrasive grain size in finishing of the surface to be sputtered of the target was changed such that the surface had an arithmetic mean roughness Ra of 2.0 μm and a maximum height Ry of 20 μm to thereby produce a target according to Comparative Example 2-2. All other conditions were the same as in Example 2-1.

<Evaluation of Number of Occurrences of Anomalous Discharge>

The number of occurrences of anomalous discharge was evaluated for the targets according to Examples 2-1 and 2-2 and Comparative Examples 2-1 and 2-2. Specifically, the targets according to Examples 2-1 and 2-2 and Comparative Examples 2-1 and 2-2 were each installed in a sputtering apparatus and used to perform DC sputtering. Note that the inside of the sputtering apparatus was evacuated to $1\times10^{-4}$ Pa or lower, and Ar gas and $O_2$ gas were introduced into the apparatus to provide an apparatus internal pressure of 0.3 Pa. The partial pressure of oxygen ($[O_2]/[Ar+O_2]$) was set as 70%. A DC power supply was used to apply 5 W/cm² of electrical power and sputtering was performed for 30 minutes. An arcing counter was used to count the number of occurrences of anomalous discharge during sputtering. Note that anomalous discharge straight after discharge was not counted. The obtained results are shown in Table 2.

TABLE 2

| Target | Arithmetic mean roughness Ra (μm) | Maximum height Ry (μm) | Number of occurrences of anomalous discharge |
|---|---|---|---|
| Example 2-1 | 0.5 | 4.0 | 0 |
| Example 2-2 | 1.5 | 10.0 | 0 |
| Comparative Example 2-1 | 1.6 | 12.0 | 20 |
| Comparative Example 2-2 | 2.0 | 20.0 | 70 |

It can be seen from Table 2 that when the element X was Mo, the number of occurrences of anomalous discharge was 0 for the targets according to Examples 2-1 and 2-2 that each satisfied a condition of the surface to be sputtered thereof having an arithmetic mean roughness Ra of 1.5 μm or less or a maximum height Ry of 10 μm or less, and these targets therefore enable sputtering without anomalous discharge. In contrast, it can be seen that the number of occurrences of anomalous discharge was at least 20 for Comparative Examples 2-1 and 2-2 in which the surface to be sputtered of the target had an arithmetic mean roughness Ra of more than 1.5 μm or a maximum height Ry of more than 10 μm.

INDUSTRIAL APPLICABILITY

According to this disclosure, it is possible to provide a Mn—Zn—O sputtering target that can be used for DC sputtering and is particularly suitable for forming a recording layer of an optical information recording medium, and also to provide a production method for the Mn—Zn—O sputtering target.

REFERENCE SIGNS LIST

S10 mixing step
S20 sintering step
S30 finishing step

The invention claimed is:

1. A production method for producing a Mn—Zn—O sputtering target comprising a chemical composition containing Mn, Zn, O, and at least one of metallic W and metallic Mo, and having a surface to be sputtered, the method comprising:
   a mixing step of wet mixing a mixed powder including a powder of an oxide of manganese, a powder of an oxide of zinc, and a metal powder containing at least one of metallic W and metallic Mo for 12 hours or more;
   a sintering step of sintering the mixed powder at a temperature of 700° C. or higher and 900° C. or lower after the mixing step; and
   a finishing step of smoothing the surface to be sputtered of the Mn—Zn—O sputtering target after the sintering step to have an arithmetic mean roughness Ra of 1.5 μm or less or a maximum height Ry of 10 μm or less.

2. The production method according to claim 1, wherein the mixed powder further includes a powder containing a simple substance or a compound of at least one element selected from the group consisting of Cu, Mg, Ag, Ru, Ni, Zr, Sn, Bi, Ge, Co, Al, In, Pd, Ga, Te, V, Si, Ta, Cr, and Tb.

3. The production method according to claim 2, wherein the at least one element selected from the group consisting of Cu, Mg, Ag, Ru, Ni, Zr, Sn, Bi, Ge, Co, Al, In, Pd, Ga, Te, V, Si, Ta, Cr, and Tb has a content of 8 at % to 70 at % relative to 100 at %, in total, of constituent elements of the Mn—Zn—O sputtering target, exclusive of O.

* * * * *